(12) United States Patent
Kim et al.

(10) Patent No.: US 12,728,804 B2
(45) Date of Patent: Sep. 8, 2026

(54) VEHICLE VIDEO RECORDING DEVICE AND METHOD OF CONTROLLING THE SAME

(71) Applicants: Hyundai Motor Company, Seoul (KR); Kia Corporation, Seoul (KR)

(72) Inventors: Kyoung Jun Kim, Hwaseong-Si (KR); Tae Gyoo Woo, Hwaseong-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 73 days.

(21) Appl. No.: 18/966,470

(22) Filed: Dec. 3, 2024

(65) Prior Publication Data

US 2026/0008421 A1 Jan. 8, 2026

(30) Foreign Application Priority Data

Jul. 3, 2024 (KR) ........................ 10-2024-0087538

(51) Int. Cl.

*B60R 16/023* (2006.01)
*B60Q 1/08* (2006.01)
*B60Q 1/24* (2006.01)
*B60R 1/23* (2022.01)
*G01R 31/382* (2019.01)

(52) U.S. Cl.

CPC ............ *B60R 16/023* (2013.01); *B60Q 1/085* (2013.01); *B60Q 1/249* (2022.05); *B60R 1/23* (2022.01); *G01R 31/382* (2019.01)

(58) Field of Classification Search

CPC ......... B60R 16/023; B60R 1/23; B60Q 1/085; B60Q 1/249; B60Q 2300/45; G01R 31/382; G08G 1/16

USPC ............................................................ 701/36

See application file for complete search history.

(56) References Cited

U.S. PATENT DOCUMENTS

| | | | | |
|---|---|---|---|---|
| 12,017,585 | B2 * | 6/2024 | Yamashita | B60R 1/00 |
| 12,028,951 | B2 * | 7/2024 | Xu | H05B 45/12 |
| 12,397,732 | B2 * | 8/2025 | Ota | B60R 21/01538 |
| 12,420,741 | B2 * | 9/2025 | Sawada | B60R 25/31 |
| 2007/0032928 | A1 * | 2/2007 | Kuwahara | G07C 5/0891 348/148 |
| 2009/0134606 | A1 * | 5/2009 | Schofield | B60C 23/00 280/727 |
| 2012/0169526 | A1 * | 7/2012 | Reilhac | B60W 50/0098 701/1 |
| 2014/0176718 | A1 * | 6/2014 | Kim | G06V 20/58 348/148 |
| 2015/0145695 | A1 * | 5/2015 | Hyde | G08G 1/166 340/905 |
| 2017/0234976 | A1 * | 8/2017 | Grauer | G01S 17/18 356/5.04 |
| 2018/0334099 | A1 * | 11/2018 | Gao | B60R 1/23 |
| 2018/0354408 | A1 * | 12/2018 | Sung | B60Q 1/143 |
| 2019/0066397 | A1 * | 2/2019 | Du | G07C 5/00 |

(Continued)

*Primary Examiner* — Krishnan Ramesh
(74) *Attorney, Agent, or Firm* — Banner & Witcoff, Ltd.

(57) ABSTRACT

An example of the present disclosure relates to A vehicle video recording device, including an event determination unit configured to detect at least one event between an external impact of a vehicle and a motion of an external object, a video recording unit configured to record an event video in response to the event being detected, and a cooperative control determination unit configured to output a lamp control signal based on illuminance information in response to the event video being recorded.

20 Claims, 4 Drawing Sheets

LOW ILLUMINANCE CONDITION, VIDEO QUALITY IMPROVEMENT THROUGH ILLUMINANCE CONTROL

(56) References Cited

U.S. PATENT DOCUMENTS

| | | | | |
|---|---|---|---|---|
| 2019/0111835 | A1* | 4/2019 | Remberg Bueno | G06V 20/63 |
| 2019/0143908 | A1* | 5/2019 | Koravadi | H04N 7/183 315/82 |
| 2019/0193632 | A1* | 6/2019 | Lewis | B60R 1/24 |
| 2020/0001774 | A1* | 1/2020 | Kim | B60Q 1/143 |
| 2022/0161713 | A1* | 5/2022 | Persson | G06V 20/58 |
| 2022/0274526 | A1* | 9/2022 | Yamashita | B60R 1/00 |
| 2023/0073997 | A1* | 3/2023 | Xu | H05B 45/12 |
| 2024/0096189 | A1* | 3/2024 | Shimotani | H04N 7/185 |
| 2024/0144750 | A1* | 5/2024 | Bohman | G07C 5/0808 |
| 2024/0149827 | A1* | 5/2024 | Sawada | B60R 25/305 |
| 2024/0336215 | A1* | 10/2024 | Ota | B60R 21/01538 |
| 2025/0026265 | A1* | 1/2025 | Kim | B60Q 9/008 |
| 2025/0033565 | A1* | 1/2025 | Carter | G01S 7/022 |
| 2025/0232593 | A1* | 7/2025 | Baijal | G06V 20/625 |
| 2025/0232594 | A1* | 7/2025 | Yabushita | G06V 20/58 |

* cited by examiner

| | EVENT | LAMP CONTROL SIGNAL |
|---|---|---|
| EXTERNAL IMPACT EVENT RECORDING PERFORMANCE | FRONT IMPACT | HEAD LIGHT TURN ON |
| | REAR IMPACT | REAR LIGHT TURN ON |
| | SIDE IMPACT | HEAD LIGHT + REAR LIGHT + WELCOME LIGHT TURN ON |
| MOTION DETECTING EVENT RECORDING PERFORMANCE | MOTION DETECTING WITHIN 5M FORWARD | HEAD LIGHT TURN ON |
| | MOTION DETECTING EXCEEDING 5M FORWARD | HEAD LIGHT TURN ON + HIGH BEAM LIGHT TURN ON |
| | REAR MOTION DETECTING | REAR LIGHT TURN ON |

FIG. 3

VEHICLE VIDEO RECORDING DEVICE AND METHOD OF CONTROLLING THE SAME

CROSS-REFERENCE TO RELATED APPLICATION

The present application claims priority to Korean Patent Application No. 10-2024-0087538, filed Jul. 3, 2024, the entire contents of which are incorporated herein by reference for all purposes.

TECHNICAL FIELD

The present disclosure relates to a vehicle video recording device and a method of controlling the same.

BACKGROUND

A vehicle video recording device includes a device that records videos of driving or parking situations of a vehicle.

The vehicle video recording device may be provided to obtain videos that record accidents while driving, and thus referred to as a driving video recording device.

The vehicle video recording device may include a controller, a memory for storing videos, and a camera for recording images to obtain the videos.

The vehicle video recording device may store the driving data of a vehicle and the videos of surroundings of the vehicle while driving, and record videos according to input settings when a predetermined event occurs while parking.

Some vehicle video recording device may be referred to as a black box and provided as an external device, but some vehicle video recording device may be provided as a built-in device in a vehicle before vehicles are released.

The built-in vehicle video recording device has an advantage over an external device in terms of accessibility to driving data and engagement with other controllers. Therefore, the use of the built-in vehicle video recording device is expected to increase gradually.

The vehicle video recording device may continuously record events while driving or parking, and may be linked with an AVN to enable system settings, and confirm the stored videos.

The vehicle video recording device (referred to as black box) including aftermarket products may record videos regardless of day or night, or low illuminance under parking conditions and in this case, it may be difficult to verify information on the recorded videos due to image quality deterioration caused by low illuminance. For example, there may be many cases where the license plate numbers are not identified and the surroundings near the vehicle are not verified.

There may be a need to develop a vehicle video recording device to accurately recognize important information on the recorded videos at night or in a low-illuminance environment.

The matters described in this Background section are only for the enhancement of understanding of the background of the disclosure, and should not be taken as acknowledgment that they correspond to prior art already known to those skilled in the art.

SUMMARY

An example of the present disclosure provides a controlling method for supporting an illuminance in recording environments through collaboration control with the lamp provided in a vehicle when video information is recorded through a camera in a vehicle video recording device under the condition where the vehicle is parked in the low-illuminance environment.

The technical problems to be achieved in the present disclosure are not limited to the technical problems mentioned above, and other technical problems not mentioned shall be clearly understood by those skilled in the art to which the present disclosure belongs from the description below.

An example of the present disclosure is related to providing a vehicle video recording device including an event determination unit configured to detect at least one event of an external impact of a vehicle or a motion of an external object, a video recording unit configured to record an event video in response to the event being detected, and a cooperative control determination unit configured to output a lamp control signal based on illuminance information when the event video being recorded.

The illuminance information may be obtained using the event video.

The external impact may include at least one of a front impact, a rear impact or a side impact.

The lamp control signal may include a headlight turn-on signal being output in response to the front impact, a rear light turn-on signal being output in response to the rear impact, or a headlight, rear light, or welcome light turn-on signal being output in response to the side impact.

The motion of the external object may include at least one of a motion being detected within a forward set distance, a motion being detected beyond a forward set distance, or a motion being detected from a rear side.

The lamp control signal may include a headlight turn-on signal in response to the motion being detected within the forward set distance, a high beam turn-on signal in response to the motion being detected beyond the forward set distance, and a rear light turn-on signal in response to the motion being detected from the rear side.

The cooperative control determination unit may be further configured to output the lamp control signal based on battery charging state information of a battery of the vehicle.

The cooperative control determination unit may be further configured to output the lamp control signal to a lamp control unit.

The lamp control signal may include information on a location of a lamp required for lighting and a lighting duration.

According to an example of the present disclosure, there is provided a method for controlling a vehicle video recording device, the method comprising detecting at least one event of an external impact of a vehicle or a motion of an external object, recording an event video in response to the event being detected, and outputting a lamp control signal based on illuminance information when the event video being recorded.

The illuminance information may be obtained using the event video.

The external impact may include at least one of a front impact, a rear impact, or a side impact.

The lamp control signal may include a headlight turn-on signal in response to the front impact, a rear light turn-on signal in response to the rear impact, or a headlight, rear light, or welcome light turn-on signals in response to the side impact.

The motion of the external object may include at least one of a motion being detected within a forward set distance, a motion being detected beyond a forward set distance, or a motion being detected from a rear side.

The lamp control signal may include a headlight turn-on signal in response to the motion being detected within the forward set distance, a high beam turn-on signal in response to the motion being detected beyond the forward set distance, and a rear light turn-on signal in response to the motion being detected from the rear side.

The outputting of the lamp control signal may include outputting the lamp control signal within a predetermined number for an identical parking recording cycle.

The outputting of the lamp control signal may include outputting the lamp control signal the lamp control signal based on battery charging state information of a battery of the vehicle.

The outputting of the lamp control signal may include outputting the lamp control signal to a lamp control unit.

The lamp control signal may include information on a location of a lamp required for lighting and a lighting duration.

According to an example of the present disclosure, when a video recording event occurs while parking, an ambient illuminance may be controlled at night or in the low-illuminance environment through collaborative control between the vehicle video recording device integrated into a vehicle and a lamp control device, thereby improving the quality of video information.

According to an example, implementation of the vehicle video recording device may be possible merely with the change to the software of the conventional vehicle video recording device without adding any additional hardware.

The effects obtainable from the present disclosure are not limited to the effects mentioned above, and other effects not mentioned shall be clearly understood by those skilled in the art to which the present disclosure belongs from the description below.

BRIEF DESCRIPTION OF DRAWINGS

FIG. 3 shows an example table chart showing lamp control signals based on lamp positions of a vehicle corresponding to events detected by an event detection unit in a vehicle video recording device according to an example of the present disclosure.

DETAILED DESCRIPTION

Figure 1:
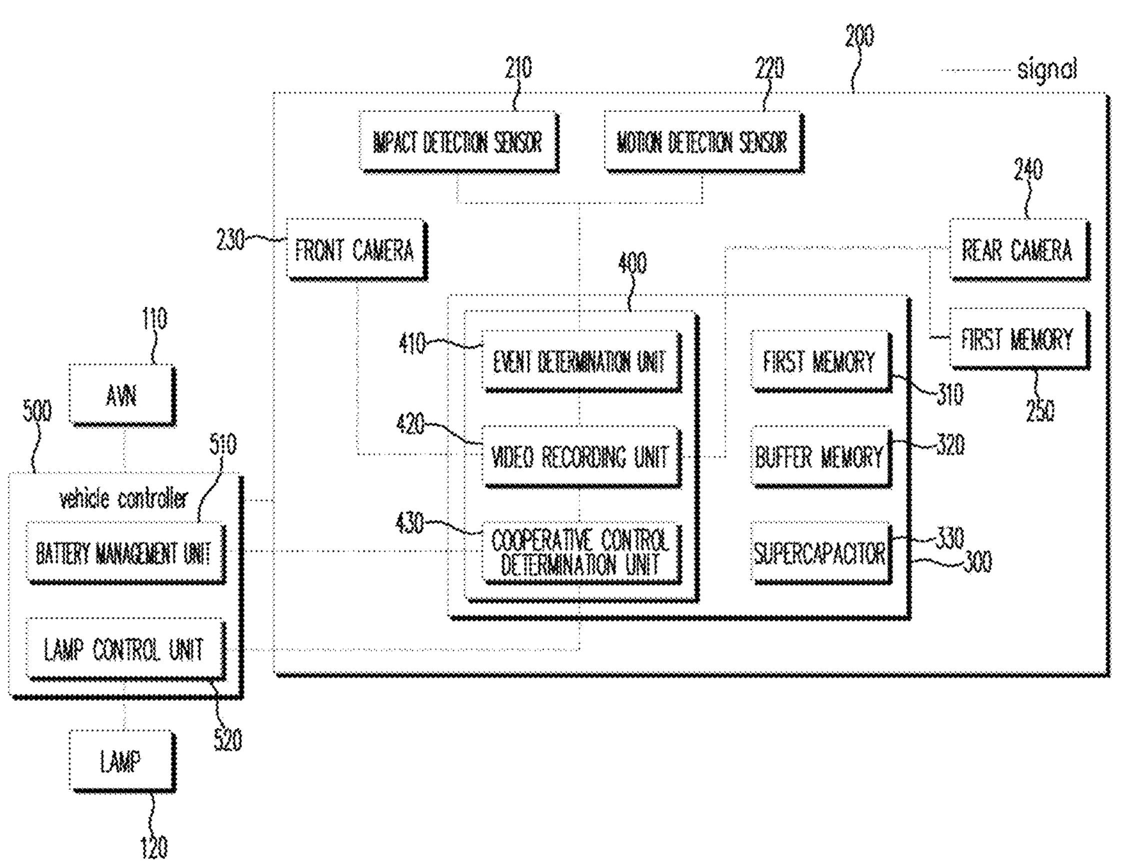
FIG. 1 shows an example view showing configurations of a vehicle video recording device and a vehicle including the same according to an example of the present disclosure.

While examples are described with reference to the accompanying drawings, it should be understood that various changes and modifications may be made in the invention. Further, it should be understood that the invention is not limited to the specific examples thereof, and various changes, equivalences, and substitutions may be made without departing from the scope and spirit of the invention.

In the examples of the present disclosure, terms such as "module", "unit", "part", and the like are terms used for nominal distinct between components, and it should not be interpreted as assuming that they are physically and chemically separated or capable of being separated or divided.

Terms containing ordinal numbers, such as "first", "second", etc., may be used to describe various components, but the components are not limited by the terms. These terms may be used only in a nominal sense to differentiate one component from another component, and their mutual sequential meaning will be understood through the context of the corresponding description, not through such terms.

The term "and/or" is used to include all instances of any combination of multiple items being the subject. For example, "A and/or B" includes all three cases: "A", "B", and "A and B". Using the exemplary phrase "at least one of: A; B; or C" or "at least one of A, B, or C," the phrase means "at least one A, or at least one B, or at least one C, or any combination of at least one A, at least one B, and at least one C. Further, exemplary phrases, such as "A, B, and C", "A, B, or C", "at least one of A, B, and C", "at least one of A, B, or C", etc. as used herein may mean each listed item or all possible combinations of the listed items. For example, "at least one of A or B" may refer to (1) at least one A; (2) at least one B; or (3) at least one A and at least one B.

When a component is used to be "coupled" or "connected" to another component, it will be understood that the component may be either connected directly to another component, or connected indirectly via another medium.

The terms in the present application are used to describe an exemplary example and do not intend to restrict and/or limit the present disclosure. Singular forms are intended to include plural forms unless the context clearly indicates otherwise. According to an example of the present disclosure, terms such as "comprise" or "consist of" are used to designate presence of characteristics, numbers, steps, operations, elements, components or a combination thereof, and do not foreclose the presence or possibility of addition of one or more other characteristics, numbers, steps, operations, elements, components or a combination thereof.

Unless otherwise defined, all terms used in the example of the present disclosure including technical or scientific terms, have the same meaning as generally understood by an ordinary person skilled in the technical field to which the present disclosure pertains. Terms defined in commonly used dictionaries will be interpreted as having a meaning consistent with the meaning in the context of the related technology, and unless clearly defined in this application, should not be interpreted in an ideal or excessively formal sense.

In addition, the terms "unit", "control unit", "control device", or "controller" are only widely used for names of devices that control the corresponding functions, and are not construed as being generic functional units. For example, devices using the terms may include a communication device that communicates with another controller or sensor to control the corresponding function, a computer-readable recording media that stores operating systems, logic commands, input/output information, etc., and at least one or more of processor that performs determination, calculation, decision, etc. used to control the corresponding function. Throughout the present disclosure, references to components, units, or modules generally refer to items that logically can be grouped together to perform a function or group of related functions. Like reference numerals are generally intended to refer to the same or similar components. Components, units, and modules may be implemented in software, hardware or a combination of software and hardware. The components, units, modules, and/or functions described above may be implemented and/or performed by one or more processors. For examples, the components, units, and/or modules may include processor(s), microprocessor (s), graphics processing unit(s), logic circuit(s), dedicated circuit(s), application-specific integrated circuit(s), programmable array logic, field-programmable gate array(s), controller(s), microcontroller(s), and/or other suitable hardware. The components, units, and/or modules may also include software control module(s) implemented with a processor or logic circuitry for example. The components, units, and/or modules may include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware. One or more storage type media may include any or all of the tangible memory of computers, processors, or the like, or associated modules thereof, such as various semiconductor memories, tape drives, disk drives and the like, which may provide non-transitory storage at any time for software programming.

A processor may include a semiconductor integrated circuit and/or electronic elements that perform at least one or more of comparison, determination, calculation, and decision to achieve a programmed function. For example, the processor may be one or the combination of a computer, a microprocessor, a CPU, an ASIC, and electronic circuits (circuitry, logic circuits).

The processor may be electrically connected to the memory, and the processor may load and record data from the memory. The memory and the processor may be integrated or may be physically separated.

An example of the present disclosure will be explained with reference to the drawings.

FIG. 1 shows an example view showing configurations of a vehicle video recording device and a vehicle including the same according to an example of the present disclosure.

FIG. 1 shows components related to an example of the present disclosure and in actual implementation, it is obvious more components may be included in a vehicle 100 and a vehicle video recording device 200. The vehicle video recording device 200 may be a built-in type, but the present disclosure is not limited thereto.

Referring to FIG. 1, a processor 400 may include an event determination unit 410, a video recording unit 420, and a cooperative control determination unit 430. The event determination unit 410, the video recording unit 420, and the cooperative control determination unit 430 may be implemented by respective processors that perform functions, or implemented by one or two processors when two or three functions are integrated. An example of the present disclosure exemplifies the case where three functions are integrated to embody the processor 400.

The processor described herein may be a central processing unit (CPU) or a semiconductor device that processes instructions stored in a memory and/or a storage. The memory and the storage may include various types of volatile or non-volatile storage media. For example, the memory may include a read only memory (ROM) and a random access memory (RAM).

Accordingly, the operations of the method or algorithm described in connection with the examples disclosed in the specification may be directly implemented with a hardware module, a software module, or a combination of the hardware module and the software module, which is executed by the processor. The software module may reside on a storage medium (that is, the memory and/or the storage) such as a RAM, a flash memory, a ROM, an EPROM, an EEPROM, a register, a hard disc, a removable disk, and a CD-ROM.

The exemplary storage medium may be coupled to the processor. The processor may read out information from the storage medium and may write information in the storage medium. Alternatively, the storage medium may be integrated with the processor. The processor and the storage medium may reside in an application specific integrated circuit (ASIC). The ASIC may reside within a user terminal. In another case, the processor and the storage medium may reside in the user terminal as separate components.

The event determination unit 410 may detect external impacts of the vehicle and motions of external objects through a sensor and transmit an event trigger signal to the video recording unit 420.

The sensor for detecting events in the event determination unit 410 may include an impact detection sensor 210 and/or a motion detection sensor 220.

The impact detection sensor 210 that detects the external impact of the vehicle may include an accelerating sensor or a gyro sensor and determine whether a collision occurs to the vehicle to cause the vehicle to move.

For example, an accelerating sensor may comprise device that measures the rate of change of velocity (or acceleration) of an object in motion or at rest. The accelerating sensor may detect acceleration along one or more axes (e.g., X, Y, Z) and provide data about motion, orientation, or vibration. For example, a gyro sensor may comprise a device that measures angular velocity, which is the rate of rotation around a specific axis. The gyro sensor may detect changes in orientation and rotational movement, making it useful for applications requiring precise motion tracking and stability.

Types of sensors included in the impact detection sensor 210 are not limited and any form of sensors that detect the impact to the vehicle may be included. The impact detection sensor 210 may be exclusively included in the vehicle video recording device 200, but it is obvious that an accelerating sensor placed in the vehicle 100 may also be used.

The motion detection sensor 220 that detects the motion of an external object may include at least one of radar, lidar, ultrasonic, and infrared sensors, and detect the distances between the vehicle and the external objects that move in front or behind the vehicle. The types of sensors included in the motion detection sensor 220 are not limited, and any form of sensors that detect the motions of the external objects of the vehicle may be included. The motion detection sensor 220 may be exclusively provided in the vehicle video recording device 200, but it is obvious that the radar sensor placed in the vehicle 100 may also be used.

The signals of the impact detection sensor 210 and the motion detection sensor may be the criteria for starting recording videos, the sensitivity of the impact detection and motion, and the motion detection area settings set by a user.

For example, the user may select the sensitivity of the impact detection and motion, which is the criteria for recording events, and set the motion detection areas when setting the vehicle video recording device 200 through an AVN 110 screen provided in the vehicle 100.

For example, the impact and motion detection sensitivity may include five levels such as a first step (e.g., very insensitive), a second step (e.g., insensitive), a third step (e.g., normal), a fourth step (e.g., sensitive), and a fifth step (e.g., very sensitive), and the motion detection area settings may be set by adding the desired area or removing an unwanted are in the basic settings by the user.

The video recording unit 420 may receive an event trigger signal and record an event video if an event is detected in the event determination unit 410. As the video recording unit 420 determines to record the event video, a camera may receive a signal from a control unit 300, and start recording videos related to the event.

The camera for recording the event video in the video recording unit 420 may include a front camera 230 and a rear camera 240 according to an example. However, the present disclosure is not limited thereto. The front camera 230 may record the front area of the vehicle 100, and the rear camera 240 may record the rear area of the vehicle 100.

For example, the front camera 230 may be placed near room mirrors in the cabin of the vehicle 100 of window shields, and the rear camera 240 may be placed on the rear window or the rear bumper of the cabin of the vehicle 100.

The front camera 230 and the rear camera 240 may include the image quality of any one of HD, FHD, and Quad HD levels, for example.

The image quality of the front camera 230 and the rear camera 240 may not be identical but may be different, and it is obvious that a camera from Advanced Driving Assistance System (ADAS) of the vehicle 100 may be used.

The camera may include an aperture value of F2.0 or lower, preferably F1.6 or lower. A lower aperture value may allow more light to be gathered, which enables brighter recording. Additionally or alternatively, an image-tuning technology may be applied to minimize (or reduce) noise and light loss, allowing clear recording in dark environments.

The video recorded by the camera according to the instruction from the video recording unit 420 may be stored in a first memory 250. The first memory 250 may include all types of storage devices that store data that is read by a computer system. For example, the first memory 250 may include at least one of a flash memory type, a hard disk type, a micro type, and a card type (e.g., a Secure Digital Card (SD card) or an eXtream Digital Card (XD card)), and a random access memory (RAM), a static RAM (SRAM), a read-only memory (ROM), a programmable ROM (PROM), an electrically erasable PROM (EEPROM), a magnetic RAM (MRAM), a magnetic disk, and an optical disk.

The first memory 250 may be an external device of a Micro SD of 64 Gbytes or more. For example, continuous recording while driving (e.g., referred to as 'driving continuous recording') may be possible for several hours, and continuous recording while parking (e.g., referred to as 'parking continuous recording') may be possible for up to tens of hours. Additionally or alternatively, event recording according to impact detection may be possible for up to tens of times. Event recording may include recording according to an impact occurring while driving (e.g., referred to as 'driving impact recording') and recording according to an impact occurring while parking (e.g., referred to as 'parking impact recording'). The vehicle may be in a driving mode, for example, if a vehicle engine start switch is in the 'IGN ON' (e.g., ignition on) state, and otherwise the vehicle may be in a parking mode.

The user may withdraw an SD card and connect the SC card to a desktop computer to easily identify the stored contents. The status information of the SD card may be identified through a connected car service, and it may also be possible to confirm a time for replacement according to the memory status.

The video recording unit 420 may control the front camera 230 and/or the rear camera 240 to record the video and measure the brightness of the video. For example, the front camera 230 and/or the rear camera 240 may measure the brightness value of the video by standardizing the value between 0 and 255. The front camera 230 and/or the rear camera 240 may calculate the average value of the brightness values measured within a predetermined area of the acquired video and generate illuminance information by using the calculated average brightness value. The predetermined area may indicate an area where the brightness outside the vehicle is significantly recognized.

If calculating the average brightness, the video recording unit 420 may exclude the brightness values of the lower and upper areas in a predetermined area in the image obtained by the camera to improve accuracy. The method of generating the illuminance information of the recorded image is merely an example, and it is obvious to those skilled in the art that various other specific methods may be used. Additionally or alternatively, although the present example describes that the illuminance information is generated by the camera, this is merely an example. For example, the illuminance information may be generated by allowing the video recording unit 420 to perform necessary processing such as image processing on the image obtained by the camera.

If the illumination information is generated in a camera, the information may be transmitted to the cooperative control determination unit 430 directly or through the video recording unit 420.

The cooperative control determination unit 430 may output a lamp control signal based on illumination information and event information. The event information may include information on the locations of the external impact of the vehicle and the distance between the vehicle and the external object in which the motion is detected. The cooperative control determination unit 430 may receive battery status information from a battery management unit 510 and determine whether a lamp control signal is output. The output lamp control signal may be transmitted to a lamp control unit 520. Communication between the cooperative control determination unit 430, the battery management unit 510, and the lamp control unit 520 may use Local Interconnect Network (LIN) or Controller Area Network (CAN) communication or Ethernet.

The battery management unit 510 may transmit vehicle battery status information to the cooperative control determination unit 430. If vehicle battery is not fully charged, the vehicle battery may be discharged while the lamp is turned on. If the charging state is greater than a SOC (State of Charge), the cooperative control determination unit 430 may output a lamp control signal. The standard of the SOC may vary depending on the capacities and types of batteries of the vehicle.

The lamp control unit 520 may control the lamp by receiving the lamp control signal from the cooperative control determination unit 430. The lamp control signal may include the location of a lamp 120 and the lighting duration information required for turning on the light. The lamp 120 that operates in the vehicle 100 may include headlights, high beams, tail lights, fog lights, side turn signal lights, parking lights, side signal warning lights, dashboard lights, interior lights, stop lights, license plate lights, reverse lights, welcome lights, and the like, and at least one of the lamps may be determined based on the location information. The location information may be, for example, information on the front side, rear side, left front side, right front side, left rear side, and right rear side of the vehicle, or may be identification information directly indicating the lamps.

For example, various types of controllers may be needed to control the lamps, and the controlling method of the lamp of each controller may be differently designed according to the system of the vehicle. According to an example, the controllers may be referred to as a lamp control unit 520. The lamp control unit 520 may communicate with the lamp 120 in a wired or wireless manner, receive the lamp control signal from the cooperative control determination unit 430, and transmit a light-on signal to the lamp 120. If the lamp control unit 520 is connected to the lamp 120 in a wired method, it is desirable that the lamp control unit 520 is connected to the line extended from the lamp 120 with a connector. If the line extended from the lamp 120 may be extended to a printed circuit substrate, the line may be connected by soldering.

The control unit 300 may control other components as described above to perform continuous recording while driving, continuous recording while parking, event recording according to an impact signal from an impact detection sensor, etc. During recording, driving information of the vehicle 100 may be recorded together. The driving information of the vehicle 100 may include time, vehicle speed, gear position, direction indicator information, impact detection level (e.g., corresponding one of the five stages described above), global positioning system (GPS) location information, etc.

Vehicle driving information may be transmitted from the vehicle controller 500, but it may be directly received from the corresponding module or the components of the vehicle 100. For example, the vehicle speed may be directly received from a speed sensor of the vehicle 100, and direction indication information (or turn signal information from a turn signal controller) may be directly transmitted from a direction indicator controller, and GPS location information may be transmitted from an AVN or a GPS receiver.

Event video recording may be performed if an event occurs while parking according to external impact detection or external object motion sensitivity set by the user.

During event video recording, recording may continue from a set time before the event to a set time after the event, and the set times may be selected by the user.

The AVN 110 may be in communication connection with the control unit 300 directly or through the vehicle controller 500. The AVN 110 screen may function as a user interface to receive selections of various setting parameters of the vehicle video recording device 200 from the user.

The control unit 300 may transmit the recorded contents to an external server according to the predetermined period, the user selection, or the occurrence of a predetermined event by a user (e.g., impact detection and external object motion).

The control unit 300 may include the processor 400 in which the event determination unit 410, the video recording unit 420, and the cooperative control determination unit 430 are incorporated, and may include a second memory 310, a buffer memory 320, and a super-capacitor 330 to perform the functions.

For example, the processor 400 may include semiconductor integrated circuits and/or electronic components that perform at least one or more of comparing, judging, calculating, and determining to achieve programmed functions. For example, the processor 400 may be any one or a combination of a computer, a microprocessor, a CPU, an ASIC, electronic circuitry, and logic circuits.

The second memory 310 may include all types of storage devices that store data that is read by a computer system and may include at least one of memories such as a flash memory type, a hard disk type, a micro type, and a card type (e.g., a Secure Digital Card (SD card) or an eXtream Digital Card (XD card)), and memories such as a Random Access Memory (RAM), a Static RAM (SRAM), a Read-Only Memory (ROM), a Programmable ROM (PROM), an Electrically Erasable PROM (EEPROM), a Magnetic RAM (MRAM), a magnetic disk, and an optical disk.

The second memory 310 may store the operation software of the control unit 300 including a logic for performing the functions of the event determination unit 410, the video recording unit 420 and the cooperative control determination unit 430. The processor 400 may read and execute the software and perform the function of the control unit 300. The control unit 300 may include the buffer memory 320 for determination, calculation, etc. of the processor 400.

The control unit 300 may include a supercapacitor 330. The supercapacitor 330 may be charged when power is applied to the control unit 300. When power is suddenly stopped due to impact or damage, the power charged in the supercapacitor 330 may be used to complete saving the ongoing video. The supercapacitor 330 may include a charging capacity for maintaining power that lasts for several to several tens of seconds.

Figure 2:
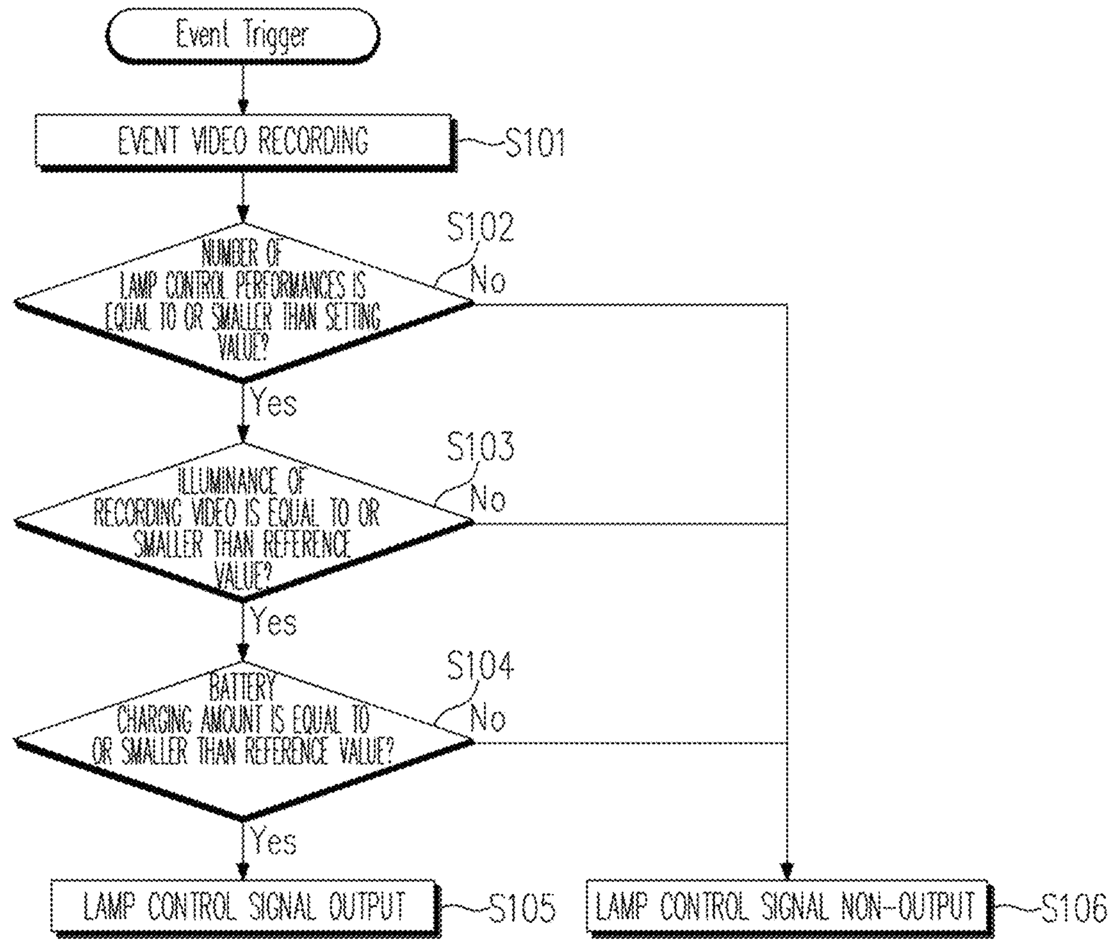
FIG. 2 shows an example flow chart showing a lamp control signal output method in a control unit of a vehicle video recording device according to an example of the present disclosure.

FIG. 2 shows an example flow chart to explain a lamp control signal output method in a control unit of a vehicle video recording device according to an example of the present disclosure.

Referring to FIG. 2, the event determination unit 410 may detect an external impact and an external object motion and transmit an event trigger to the video recording unit 420 so that the video recording unit 420 may provide a command to the front camera 230 and/or the rear camera 240 to start recording an event video at step S101.

Within the same parking recording cycle (e.g., a recording target time section of the same parking state, i.e., a time section from the start to the end of the corresponding parking state), if the number of lamp controls exceeds a preset value, the lamp control signal may not be output, and if the number of lamp controls is lower than the preset value, a recording video illuminance reference value confirmation step may be performed at step S102. Through the lamp control, the power consumption within the vehicle 100 may be reduced.

If the illuminance of the event recording video exceeds the reference value, the lamp control signal may not be output, and if the illuminance of the event recording video is below the reference value, the battery state identification step may be performed at step S103. The reference value for illuminance may be adjusted according to the settings by the user. For example, adjustment may be performed based on the degree of license plate recognition according to the illuminance at different distances.

It may be identified whether the battery state of charge (SOC) is equal to or greater than a reference value at step S104. If the vehicle battery is not sufficiently charged, the vehicle battery may discharge while the lamp is turned on. Therefore, there is a need for setting the state of charge (SOC) reference value to output a lamp lighting signal. The state of charge (SOC) reference value may vary depending on the vehicle battery capacity and type.

If the state of battery (SOC) is equal to or greater than the reference value, the lamp control signal may be output at step S105, and the state of battery (SOC) is smaller than the reference value, the lamp control signal may not be output at step S106.

FIG. 3 shows an example table chart showing a lamp control signal based on a lamp location of a vehicle corresponding to an event detected by an event determination unit of a vehicle video recording device according to an example of the present disclosure.

Referring to FIG. 3, the event detected by an event determination unit 310 may include an external impact event and a motion detection event.

The external impact event may include at least one of a front impact, a rear impact, and a side impact. As the lamp control signal corresponds to the external impact event, a headlight turn-on signal may be output in the case of a front impact, a tail light turn-on signal may be output in the case of a rear impact, and a headlight, a tail light, and a welcome light turn-on signal may be output in the case of a side impact.

The motion detection event may include at least one of within 5 m (or any other value) in front of motion detection, more than 5 m (or any other value) in front of motion detection, and rear motion detection. The lamp control signal corresponding to the motion detection event may output a headlight turn-on signal if within 5 m (or any other value) in front of motion detection, output headlight and a high beam turn-on signal if more than 5 m (or any other value) in front of motion detection, and output a tail light turn-on signal if in the rear motion detection.

one of ordinary skilled in the art would understand that this is only exemplary and may be applied in various other specific forms.

Figure 4:
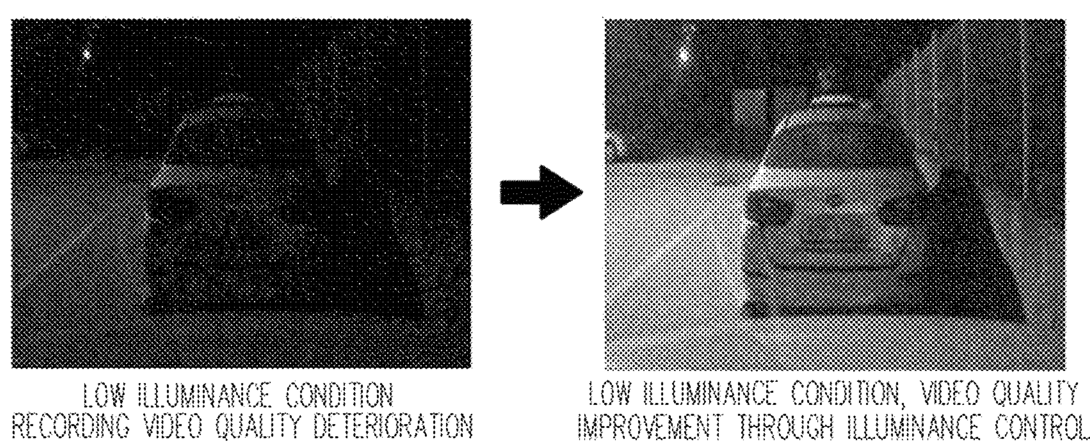
FIG. 4 shows an example view showing a comparison between a recorded video with lamp control signals output in a low-illuminance situation and a video to which the technology disclosed in the present disclosure is not applied.

FIG. 4 shows an example view showing the comparison between a video in which a lamp control signal is output and recorded in a low illuminance situation and a video to which the technology of the present disclosure is not applied.

The drawing of FIG. 4 on the right may indicate a video recorded under low-illuminance conditions at night according to an example of the present disclosure. Compared to a video to which the technology of the present disclosure is not applied (the drawing on the left), it appears that the quality of the recorded video is improved.

It will be appreciated by those skilled in the art that changes may be made to these exemplary examples without departing from the principles and spirit of the present disclosure. Accordingly, the scope of the present disclosure is not construed as being limited to the described exemplary examples. The scope of the present disclosure should be determined by a reasonable interpretation of the appended claims, and all changes within the equivalent scope of the present disclosure are intended to be included within the scope of the present disclosure.

The method according to the above-described example may be produced as a program to be executed on a computer, and the program may be stored in a computer-readable recording medium. Examples of the computer-readable recording medium may include a ROM, a RAM, a CD-ROM, a magnetic tape, a floppy disk, an optical data storage device, and the like, and also include a recording medium implemented in the form of a carrier wave (e.g., transmission via the Internet).

The computer-readable recording medium may be distributed over network-connected computer systems so that the computer-readable code may be stored and executed in a distributed manner. In addition, functional programs, codes, and code segments for implementing the above-described method may be easily inferred by programmers in the technical field to which an example of the present disclosure belongs.

It will be apparent to those skilled in the art that the present disclosure may be embodied in other specific forms without departing from the spirit and essential features of the present disclosure.

Accordingly, the above-detailed description should not be construed as restrictive in all respects but should be considered as illustrative. The scope of the present disclosure should be determined by a reasonable interpretation of the appended claims, and all changes within the equivalent scope of the present disclosure are intended to be included in the scope of the present disclosure.

What is claimed is:

1. An apparatus of a vehicle, the apparatus comprising:
- a video recording device configured to record at least one event video;
- at least one sensor configured to detect sensing information associated with the vehicle;
- at least one processor; and
- memory storing instructions that, when executed by the at least one processor, are configured to cause the apparatus to:
  - detect, based on the sensing information, at least one event associated with the vehicle, wherein the at least one event comprises an external impact to the vehicle or a motion of an external object;
- control the video recording device to record an event video based on the at least one event being detected; and
  - control at least one lamp of the vehicle by outputting a lamp control signal, based on illuminance information around the vehicle, during the event video being recorded.

2. The apparatus of claim 1, wherein the illuminance information is obtained using the event video.

3. The apparatus of claim 1, wherein the external impact comprises at least one of: a front impact to the vehicle, a rear impact to the vehicle, or a side impact to the vehicle.

4. The apparatus of claim 3, wherein the instructions, when executed by the at least one processor, are configured to cause the apparatus to output the lamp control signal by:
- outputting a first lamp control signal in response to the front impact, wherein the first lamp control signal is configured to turn on headlights of the vehicle;
- outputting a second lamp control signal in response to the rear impact, wherein the second lamp control signal is configured to turn on tail lights of the vehicle; or
- outputting a third lamp control signal in response to the side impact, wherein the third lamp control signal is configured to turn on at least one of the headlights, the tail lights, or welcome lights of the vehicle.

5. The apparatus of claim 1, wherein the motion of the external object comprises at least one of: a motion being detected within a forward set distance, a motion being detected beyond a forward set distance, or a motion being detected from a rear side of the vehicle.

6. The apparatus of claim 5, wherein the lamp control signal comprises a headlight turn-on signal in response to the motion being detected within the forward set distance, a high beam turn-on signal in response to the motion being detected beyond the forward set distance, and a rear light turn-on signal in response to the motion being detected from the rear side.

7. The apparatus of claim 1, wherein the instructions, when executed by the at least one processor, are further configured to cause the apparatus to output the lamp control signal within a predetermined number for an identical parking recording cycle.

8. The apparatus of claim 1, wherein the instructions, when executed by the at least one processor, are further configured to cause the apparatus to output the lamp control signal based on battery charging state information of a battery of the vehicle.

9. The apparatus of claim 1, wherein the instructions, when executed by the at least one processor, are further configured to cause the apparatus to output the lamp control signal to a lamp controller configured to control a plurality of lamps of the vehicle.

10. The apparatus of claim 9, wherein the lamp control signal comprises information on a location of a lamp required for lighting and a lighting duration.

11. A method performed by an apparatus of a vehicle, the method comprising:

receiving, from at least one sensor of the vehicle, sensing information associated with the vehicle;

detecting, based on the sensing information, at least one event associated with the vehicle, wherein the at least one event comprises an external impact to the vehicle or a motion of an external object;

controlling a video recording device of the vehicle to record an event video based on the at least one event being detected; and controlling at least one lamp of the vehicle by outputting a lamp control signal, based on illuminance information around the vehicle, during the event video being recorded.

12. The method of claim 11, wherein the illuminance information is obtained using the event video.

13. The method of claim 11, wherein the external impact comprises at least one of: a front impact to the vehicle, a rear impact to the vehicle, or a side impact to the vehicle.

14. The method of claim 13, wherein the outputting the lamp control signal comprises:

outputting a first lamp control signal in response to the front impact, wherein the first lamp control signal is configured to turn on headlights of the vehicle;

outputting a second lamp control signal in response to the rear impact, wherein the second lamp control signal is configured to turn on tail lights of the vehicle; or outputting a third lamp control signal in response to the side impact, wherein the third lamp control signal is configured to turn on at least one of the headlights, the tail lights, or welcome lights of the vehicle.

15. The method of claim 11, wherein the motion of the external object comprises at least one of: a motion being detected within a forward set distance, a motion being detected beyond a forward set distance, or a motion being detected from a rear side of the vehicle.

16. The method of claim 15, wherein the lamp control signal comprises a headlight turn-on signal in response to the motion being detected within the forward set distance, a high beam turn-on signal in response to the motion being detected beyond the forward set distance, and a rear light turn-on signal in response to the motion being detected from the rear side.

17. The method of claim 11, wherein the outputting of the lamp control signal comprises outputting the lamp control signal within a predetermined number for an identical parking recording cycle.

18. The method of claim 11, wherein the outputting of the lamp control signal comprises outputting the lamp control signal the lamp control signal based on battery charging state information of a battery of the vehicle.

19. The method of claim 11, wherein the outputting of the lamp control signal comprises outputting the lamp control signal to a lamp controller configured to control a plurality of lamps of the vehicle.

20. The method of claim 19, wherein the lamp control signal comprises information on a location of a lamp required for lighting and a lighting duration.

* * * * *